United States Patent
Buckley

(10) Patent No.: US 6,631,934 B1
(45) Date of Patent: Oct. 14, 2003

(54) SILICON CARBIDE CANTILEVER PADDLE

(75) Inventor: Richard F. Buckley, Shrewsbury, MA (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 200 days.

(21) Appl. No.: 09/585,937

(22) Filed: Jun. 2, 2000

(51) Int. Cl.⁷ .............................. H01L 21/22; F27D 5/00
(52) U.S. Cl. ..................... 294/1.1; 414/940; 432/258
(58) Field of Search ................. 294/1.1, 32; 414/152, 414/156, 198, 940, 941, 938; 432/253, 258, 259

(56) References Cited

U.S. PATENT DOCUMENTS

| | | | | |
|---|---|---|---|---|
| 3,951,587 A | * | 4/1976 | Alliegro et al. | 432/253 |
| 4,218,214 A | * | 8/1980 | Nelson | 432/253 |
| 4,440,538 A | | 4/1984 | Bowers | 414/183 |
| 4,516,897 A | * | 5/1985 | Snider et al. | 414/180 |
| 4,523,885 A | * | 6/1985 | Bayne et al. | 414/941 |
| 4,624,638 A | | 11/1986 | Sarkozy | 432/253 |
| 4,671,726 A | * | 6/1987 | Thuen | 414/940 |
| 4,761,134 A | * | 8/1988 | Foster | 432/253 |
| 4,767,251 A | | 8/1988 | Whang | 414/147 |
| 4,888,994 A | * | 12/1989 | Nakamaki et al. | 414/940 |
| 4,943,234 A | * | 7/1990 | Sohlbrand | 414/940 |
| 4,954,079 A | * | 9/1990 | Yamaga | 414/940 |
| 4,976,610 A | | 12/1990 | Yates | 432/11 |
| 4,979,897 A | * | 12/1990 | Yates | 432/253 |
| 4,998,879 A | * | 3/1991 | Foster et al. | 414/940 |
| 5,050,534 A | * | 9/1991 | Yates | 118/733 |
| 5,208,961 A | * | 5/1993 | Lajoie | 432/253 |
| 5,354,198 A | * | 10/1994 | Yates | 432/5 |
| 5,765,982 A | * | 6/1998 | Martin et al. | 414/156 |
| 5,882,807 A | * | 3/1999 | Funato et al. | 428/698 |

FOREIGN PATENT DOCUMENTS

| | | | |
|---|---|---|---|
| JP | 58-207625 | 12/1983 | |
| JP | 60119715 | * 6/1985 | |
| JP | 361020319 | * 1/1986 | |
| JP | 361283117 | * 12/1986 | 432/436 |
| JP | 362004336 | * 1/1987 | 432/436 |
| JP | 62-269313 | 11/1987 | |
| JP | 401023527 | * 1/1989 | |
| JP | 401187811 | * 6/1989 | 414/940 |
| JP | 401838813 | * 7/1989 | 414/940 |
| JP | 01251713 A | 10/1989 | |
| JP | 401251713 | * 10/1989 | |
| JP | 401316938 | * 12/1989 | 414/940 |
| JP | 402039526 | * 2/1990 | 414/940 |
| JP | 03141637 | 6/1991 | |
| JP | 403141637 | * 6/1991 | |
| JP | 403295226 | * 12/1991 | |
| JP | 404113617 | * 4/1992 | 414/940 |
| JP | 407169707 | * 7/1995 | |
| JP | 407169708 | * 7/1995 | |
| JP | 407190637 | * 7/1995 | |

OTHER PUBLICATIONS

International Search Report for PCT/US01/17242 mailed Jan. 30, 2002.

* cited by examiner

Primary Examiner—Eileen D. Lillis
Assistant Examiner—Paul T. Chin
(74) Attorney, Agent, or Firm—Barry J. Marenberg; Mintz, Levin, Cohn, Ferris, Glovsky and Popeo, P.C.

(57) ABSTRACT

A silicon carbide cantilever paddle for use in semiconductor wafer processing is disclosed. The cantilever paddle is characterized in that it exhibits acceptable deflection characteristics over the entire range of weight loads with which it may be used, and that it is compatible with existing clamp systems. This is achieved by providing a "two-stage" handle having a large diameter section and a small diameter section, the sections being separated by a handle transition zone.

9 Claims, 3 Drawing Sheets

SILICON CARBIDE CANTILEVER PADDLE

FIELD OF THE INVENTION

The invention is in the field of devices used in the processing of semiconductor wafers. More particularly, the invention relates to a cantilever paddle used to position semiconductor wafer boats within processing furnaces and other processing systems.

BACKGROUND OF THE INVENTION

During processing, semiconductor wafers must often be heated within specialized furnaces. Such furnaces typically comprise elongated, cylindrical tubes. Likewise, wafers may be subjected to other processing steps, such as low pressure chemical vapor deposition, within reactors which also comprise elongated, cylindrical tubes. Wafers are positioned within the furnaces and reactors in a manner such that they are aligned along planes defined by circular cross-sections of the furnace or reactor and are spaced at predetermined, generally equidistant, points along the central axis of the furnace or reactor.

In order to achieve the desired positioning and spacing within the processing chambers, the wafers are commonly positioned in slotted holders, called wafer boats, or simply boats, which stand the wafers in a spaced configuration aligned along a central axis. In order to survive the processing conditions within the chamber, and to minimize chemical contributions to the wafers from the processing equipment, the boats and many other devices used in wafer processing are fabricated of a material such as silicon carbide (SiC).

The boats, loaded with a batch of wafers to be processed, are positioned on long cantilevered paddles, by which they may be inserted into and withdrawn from the tubular furnaces and reactors. Such paddles typically include a flattened carrier section upon which one or more boats may be positioned, and a long handle, positioned at one end of the flattened carrier section, by which the paddle can be handled. When the paddle is formed as a monolithic body, a transition section is typically formed between the handle and the carrier section. Of course, the handle must extend out of the furnace or reactor to allow it and the wafer boats to be manipulated.

Positioning of the wafer boats within the furnace or reactor is important, because to provide uniformity to the processing conditions to which the wafers will be subjected, it is desirable to position the center of each wafer as close to the central axis of the furnace or reactor as possible. Thus, bending of the paddle caused by the weight of the wafer-loaded boats must be considered in paddle designs, particularly because the paddle is supported only at one end, i.e., the end that extends from the chamber. Along with considerations of paddle design resulting from operating weight requirements, a set of clamps designed to precisely hold the extending end of the paddle in position must be used. These clamps must be considerably robust to maintain the paddle at a precise desired position, while at the same time being simple to use and minimizing the possibility of paddle damage during clamping.

Recently, manufacturers of semiconductor wafers have sought to use furnaces and reactors capable of processing greater number of wafers. Unfortunately, existing paddles cannot handle the increased weight loading of additional wafers and wafer boats. These additional weight loads cause the paddles to deflect or bend too far downward, causing them to contact the underlying chamber wall and become stuck. Although paddles with thicker handles have been proposed, early tests of these designs show that they are also unsuitable. In particular, when heavier paddles are used with lighter loads, they do not deflect enough. As a result, the mounted wafers often contact the upper wall of the furnace or reactor interior and become broken or damaged. Likewise, heavier paddles are formed using heavier handles, and such handles are not compatible with the existing clamps. Providing new clamps to secure the heavier handled paddles would be a significant economic burden.

The prior art discloses paddles or transfer jigs for use in semiconductor wafer processing. However, unlike the present invention, the prior art does not address nor overcome the disadvantages noted hereinabove. For example, in JP314637, there is disclosed a quartz glass transfer jig for a wafer boat which purports to decrease deflection without increasing the thickness of the entire jig. The jig, however, is strengthened by the provision of a reinforcement member.

JP1251713 recites that the wall of a fixed portion of a quartz glass wafer boat holding section is made thicker than that of other portions thereof by a predetermined range above a central axis in order to reduce bending stress and increase rigidity.

Thus, a need exists for a cantilever paddle that can be used with a heavier weight burden, while at the same time remaining compatible with existing clamp systems. A need also exists for a cantilever paddle that exhibits acceptable deflection characteristics over the entire range of weight loads with which it may be used.

SUMMARY OF THE INVENTION

The present invention relates to a cantilever paddle that is configured to address the problems now being encountered with prior art paddle designs. More specifically, the present invention relates to a cantilever paddle for use in semiconductor wafer processing that exhibits acceptable deflection characteristics over the entire range of weight loads with which it may be used, and that is compatible with existing clamp systems.

The inventive paddle is characterized in that it employs a handle portion configured to reduce deflection while also remaining compatible with current clamps. This is achieved by providing a "two-stage" handle having a large diameter section and a small diameter section, the sections being separated by a handle transition zone. Of course the paddle also includes a carrier section connected to the handle through a carrier transition zone.

The desirable characteristics of the two-stage handle result from one or more design parameters discussed in detail below.

DETAILED DESCRIPTION OF THE INVENTION

Figure 1:
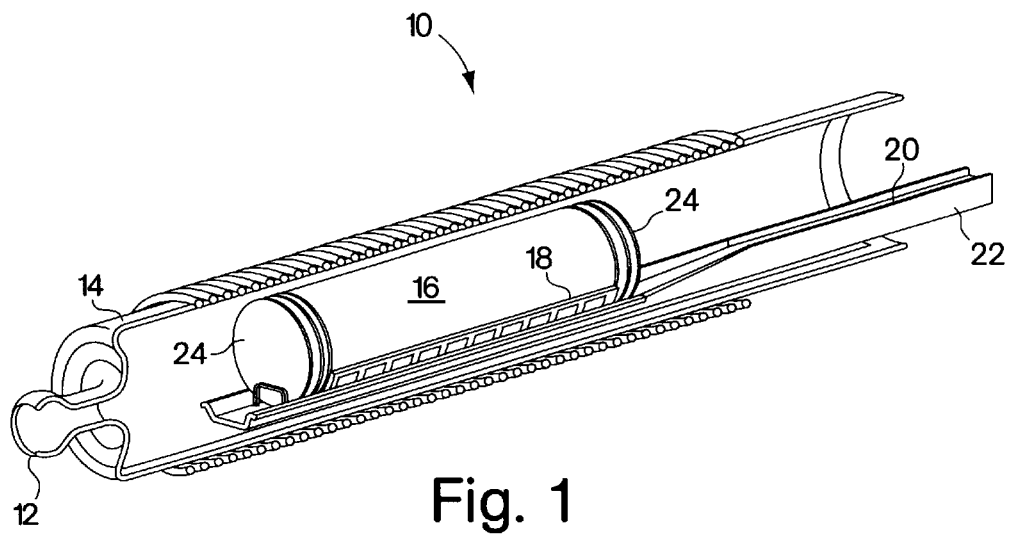
FIG. 1 illustrates a perspective view of a prior art low pressure chemical vapor deposition (LPCVD) system showing a wafer boat and a cantilever paddle.
Figure 2:
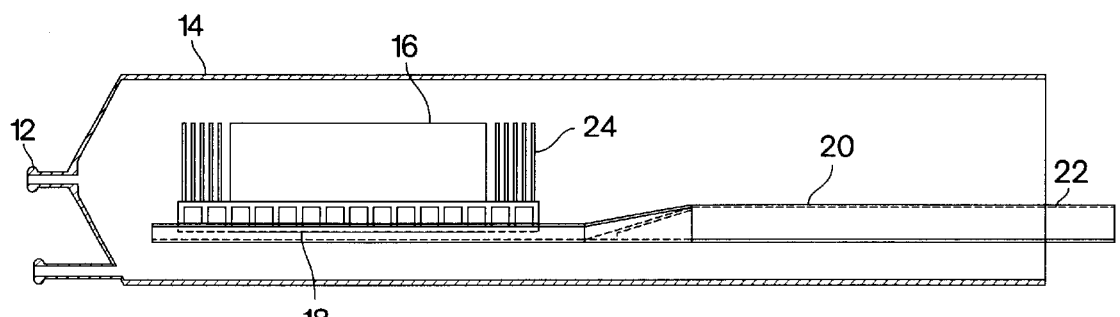
FIG. 2 is a schematic side view of a prior art low pressure chemical vapor deposition (LPCVD) system showing a wafer boat and a cantilever paddle.

A conventional low pressure chemical vapor deposition (LPCVD) system 10 is illustrated in two different views in FIG. 1 and FIG. 2. In FIG. 1 and FIG. 2, a reactor 12 comprising a lined tube formed of quartz defines a reaction chamber 14. A plurality of wafers 16 are positioned on a wafer boat 18, which in turn, is positioned on a cantilever paddle 20. The paddle 20, including the loaded boat 18, is inserted distally into the reaction chamber 14. Baffles 24 may also be included on the boat 18 adjacent to the first and last wafers 16 being processed. As can be seen in both FIG. 1 and FIG. 2, the paddle 20 includes a handle portion 22 which extends outwardly beyond the proximal end of the reaction chamber 14 and the reactor 12.

Figure 3:
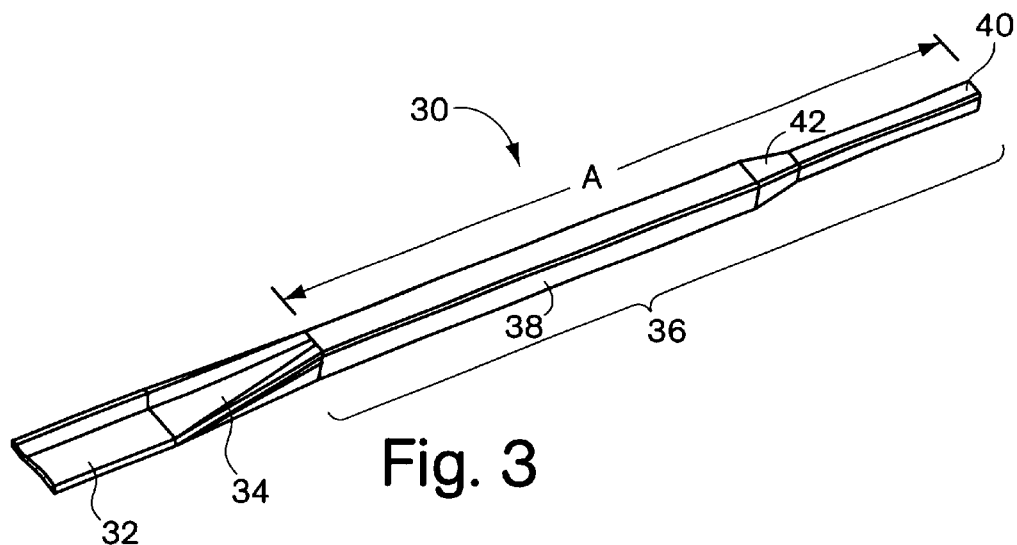
FIG. 3 is a schematic representation of a paddle of the present invention employing a two-stage handle.
Figure 4A:
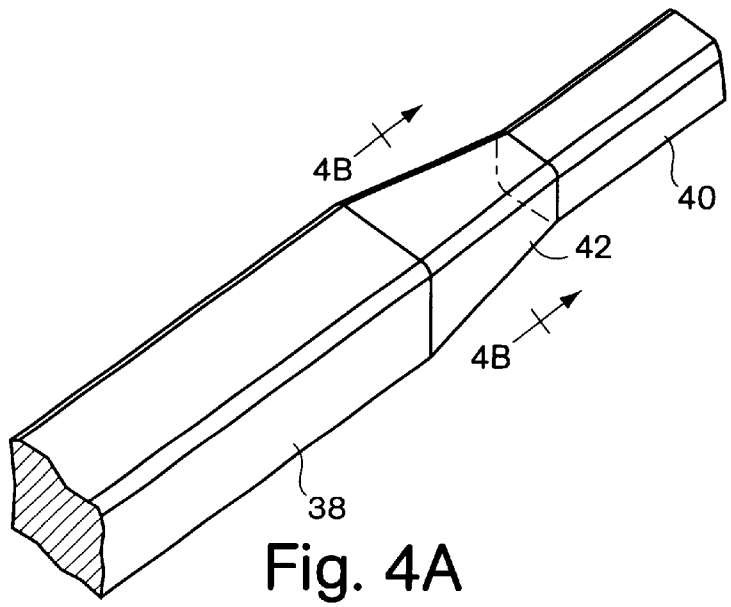
FIG. 4a is a top view of a cross-section of the handle transition zone viewed along line A shown in FIG. 4
Figure 4B:
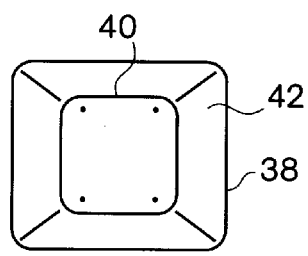
FIG. 4 is schematic representation of a handle transition zone.

The paddle 30 of the present invention and a detailed view of a handle transition zone are represented schematically in FIGS. 3 and 4. In those Figures, the paddle 30 includes a carrier zone 32, a carrier transition zone 34, and a two-stage handle 36. The two-stage handle 36 defines the effective length "A" of the handle and comprises a large diameter section 38 separated from a small diameter section 40 by a handle transition zone 42. More specifically, the effective length "A" of the handle is defined as the length of the handle beginning where the handle exits a clamp and ending at the start of the carrier transition zone. For purposes herein, the portion of the handle adjacent to the carrier zone 32 will be referred to as the distal end of the handle, and the portion of the handle which extends out of the reaction chamber 14 (FIGS. 1 and 2) and is clamped will be referred to as the proximal end of the handle. The effective length "A" extends generally from the proximal end of the handle to the distal end of the handle. As will be discussed below, the entire paddle 30 preferably comprises a monolithic ceramic such as silicon carbide (SiC), and more preferably recrystallized SiC.

The two-stage handle typically comprises an elongated cylinder having a generally square cross-section. It is configured in a manner such that it minimizes deflection over the entire range of its working load weights, while remaining compatible with conventional clamping systems. These results can be achieved using one or more of the following parameters. First, with the effective length "A" measured from the point where the proximal end of the handle 36 exits a clamp to the distal end of the handle, the handle transition zone 42 should begin no further distally than the midpoint of the effective length. Second, the height of the large diameter section 38 of the handle 36 should be no greater than twice the height of the small diameter section 40 of the handle 36. Third, the overall length of the handle transition zone 42 should be less than or equal to half of the effective length "A" of the handle 36. Finally, in a preferred embodiment, the central axis of the small diameter section 40 of the handle 36 should be substantially colinear with the central axis of the large diameter section 38 of the handle 36. Designs in which the bottom portion of the small diameter section 40 of the handle 36 forms a continuously flush surface with the bottom portion of the large diameter section 38 of the handle 36 have been found to be subject to increased stresses.

In one preferred embodiment, the large diameter section 38 of the handle 36 has a square cross-section of approximately 2 inches per side, and the small diameter section 40 of the handle 36 has a square cross-section of approximately 1.25 inches per side. Such a configuration is compatible with existing clamps used in wafer processing equipment. The handle transition zone 42 should have a length of less than about 5 inches, with a length of about 3 inches being preferred. In one embodiment, the small diameter section 40 has a length of about 12 inches and is used in connection with a clamp having a length of about 10 inches. As a result, the small diameter section 40 of the handle 36 extends approximately 2 inches beyond the clamp prior to the start of the handle transition zone 42.

In this embodiment, the carrier transition zone 34 extends for approximately 10 inches, and necks down from about 2 inches to a thickness of about 1 inch. The carrier zone 32 extends therefrom for approximately 40 inches, and has a thickness of approximately 0.2 inches. Walls may be positioned on each side of the carrier zone to help maintain placement of a wafer boat thereon. Typical walls have a thickness of about 0.2 inches, and extend above the carrier zone to a height of about 1 inch.

It should be noted herein that although the dimensions of one paddle have been described in detail above, it is contemplated that paddles having significantly different dimensions may be used as well. Accordingly, the inventors do not intend to limit the inventive paddle strictly to paddles having those dimensions described above.

As noted above, the cantilever paddles of the present invention are typically formed of SiC. One preferred SiC comprises recrystallized SiC, which is commercially available from Saint-Gobain Industrial Ceramics Inc., of Worcester, Mass. under the tradename CRYSTAR®. Such materials can comprise either recrystallized SiC or silicon impregnated SiC where semiconductor grade silicon has been used to fill porosity in the body. The silicon impregnated material can be provided with a layer of CVD-SiC to seal the surface and prevent silicon migration during use of the device in wafer processing. Recrystallized SiC, either impregnated or not, is preferred for cantilever paddles as a result of its strength at high temperatures. Specifically, CRYSTAR® material has been found to be significantly stronger than quartz throughout the semiconductor processing temperature range. As a result, the material can be used to fabricate cantilever paddles that resist thermal distortion or sagging during their working lifetimes.

EXAMPLES

Theoretical Paddle Load Testing Experiment

A cantilever paddle of the present invention was compared to three other paddles. The comparison sought to plot deflection of the paddle as a function of the load placed on the carrier zone. Of the three other paddles tested, one was a standard paddle of the type available from Saint-Gobain Industrial Ceramics Inc., Worcester, Mass., under the designation RC-30906 (comparative 1). The other two where variations on the RC-30906 design having rod-like extensions along inner and outer surfaces of the carrier zone (comparatives 2 and 3).

The inventive cantilever paddle studied had an overall length of 94 inches. It had a small diameter handle portion having a square cross-section of approximately 1.25 inches on a side and a length of approximately 12 inches. The transition zone was approximately 3 inches long and extended to a large diameter handle section having a square cross-section of approximately 2 inches on a side and a length of approximately 29 inches.

In each case, the proximal-most 10 inches of each handle were clamped, and weight loads varying from 0 to 25 pounds were placed substantially evenly throughout the carrier zones. The deflection of the distal-most end of the carrier zone was measured. Data for deflection as a function of weight are presented in the graph shown in FIG. 5. As can be seen in that Figure, when unloaded, the three comparative paddles each showed a deflection of approximately 0.1 inches, while the inventive paddle had a deflection of approximately 0.06 inches. Upon loading to the maximum weight (25 pounds), the deflection of the three comparative paddles increased substantially linearly to approximately 0.65 inches. In contrast, in the case of the inventive paddle, upon loading to the maximum weight, its deflection increased substantially linearly to approximately 0.35 inches. This difference is important, because the graph shows that deflections in excess of approximately 0.48 inches are unacceptable. As such, each of the comparative paddles exhibited unacceptable results, whereas the inventive paddle stayed well within the allowable deflection range.

Figure 5:
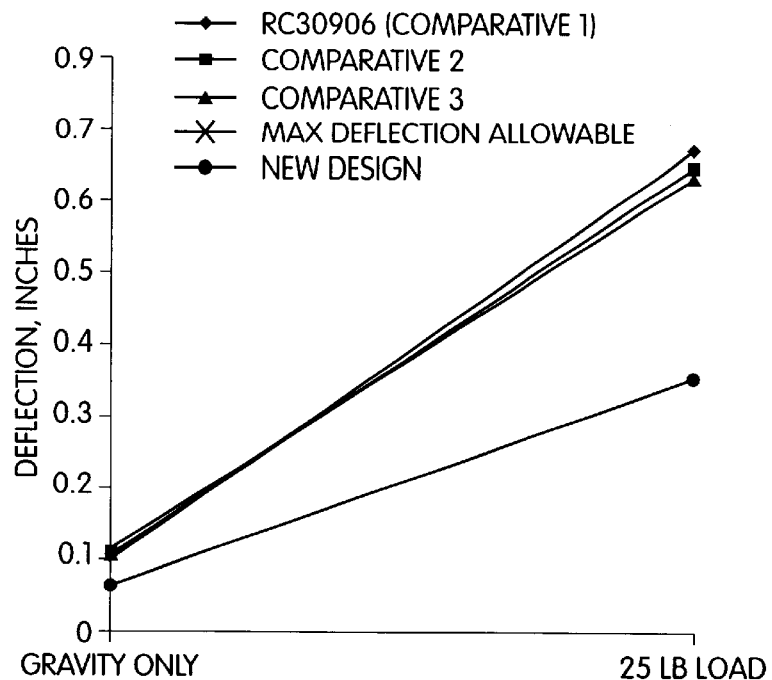
FIG. 5 is graph plotting the theoretical results of a mathematical model demonstrating deflection as a function of load in a paddle load test for four separate paddle designs.

A mathematical model directed to the four paddles using Finite Element Analysis confirms the aforementioned exemplary data. The model simulated a 10-inch handle clamp and a load on the carrier section. Gravitational effects were included in the model. Multiple models were made with load cases ranging from 0 to 25 pounds. The results were plotted and compared. As indicated in FIG. 5, the inventive paddles demonstrated a significant improvement over the other three paddles.

Paddle Load Test

To confirm theoretical analysis of the new design, two paddles were load tested. First, an actual prototype part of the new design was tested. Next, the standard 1.25" handle paddle design (Model No.MB255564, available from Saint Gobain Industrial Ceramics, Worcester, Mass.) was tested. The silicon carbide paddles were made to the same geometry as the theoretical model.

For each case, the paddle was clamped on the handle end to simulate actual loading conditions. Next the paddle was leveled and a, height gauge was calibrated to measure the deflection. The initial deflection due to weight of the paddle was measured first.

Figure 6:
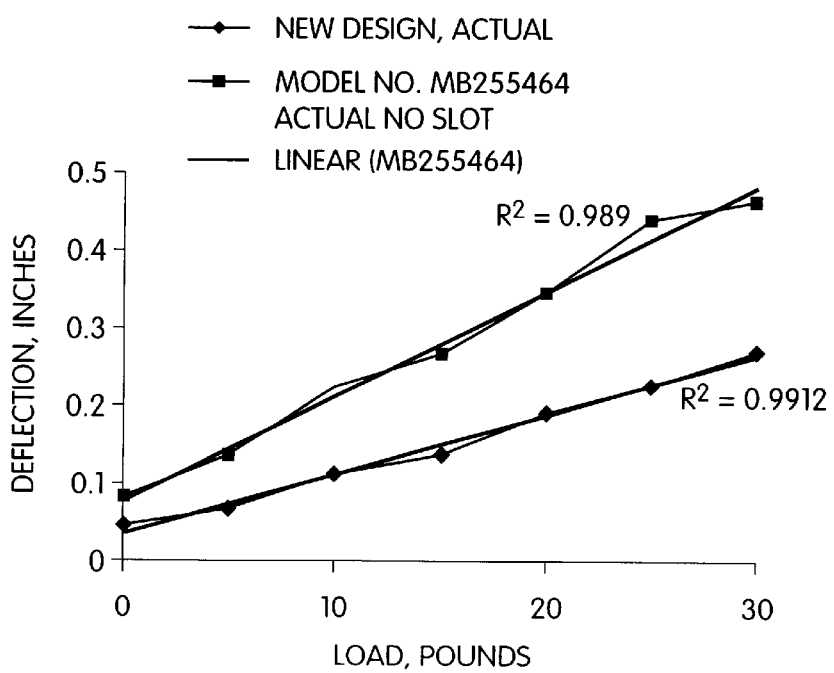
FIG. 6 is a graph plotting experimental results of deflection as a function of load in a paddle load test using the paddle of the present invention in comparison to a prior art 1.25" handle paddle.

A series of weights was placed on the load zone section. The weight was progressively increased and the data from each load case was plotted as illustrated in FIG. 6. As predicted by the theoretical analysis and mathematical model, the data sets show the paddles behaving linearly with respect to load and deflection. Based on the data sets, a straight line was interpolated and plotted for each set. As predicted by the theoretical model, the new design decreased deflection by approximately 50% from the prior design.

EQUIVALENTS

From the foregoing detailed description of the specific embodiments of the invention, it should be apparent that a novel cantilever paddle has been described. Although particular embodiments have been disclosed herein in detail, this has been done by way of example for purposes of illustration only, and is not intended to be limiting with respect to the scope of the appended claims that follow. In particular, it is contemplated by the inventors that various substitutions, alterations, and modifications may be made to the invention without departing from the spirit and scope of the invention as defined by the claims.

What is claimed is:

1. A ceramic cantilever paddle for use in semiconductor wafer processing which comprises a carrier zone extending from a handle via a carrier transition zone wherein the handle comprises two sections comprising:

a) a large diameter section having a proximal end and a distal end, the distal end of the large diameter section extending to the carrier transition zone; and b) a small diameter section having a proximal end and a distal end, the distal end of the small diameter section extending to the proximal end of the large diameter section via a handle transition zone;

the handle having an effective length "A" commencing from the proximal end of the small diameter section and extending to the carrier transition zone, and wherein:

i) the handle transition zone begins at the proximal end of the small diameter section along the effective length "A" of the handle no further distally than the midpoint of the effective length "A";

ii) the height of the large diameter section of the handle is no greater than twice the height of the small diameter section of the handle; and iii) the length of the handle transition zone is no more than half of the effective length "A".

2. The cantilever paddle of claim 1, wherein the large diameter section of the handle and the small diameter section of the handle each define a central axis, and further wherein the central axis of the large diameter section of the handle is substantially colinear with the central axis of the small diameter section of the handle.

3. A ceramic cantilever paddle for use in semiconductor wafer processing which comprises a carrier zone extending from a handle via a carrier transition zone wherein the handle comprises two sections comprising:

a) a large diameter section having a proximal end and a distal end, the distal end of the large diameter section extending to the carrier transition zone; and b) a small diameter section having a proximal end and a distal end, the distal end of the small diameter section extending to the proximal end of the large diameter section via a handle transition zone; the handle having an effective length "A" commencing from the proximal end of the small diameter section and extending to the carrier transition zone, wherein i) the handle transition zone begins along the effective length "A" of the handle no further distally than the midpoint of the effective length "A";

ii) the height of the large diameter section of the handle is no greater than twice the height of the small diameter section of the handle; and iii) the length of the handle transition zone is no more than half of the effective length "A".

4. The cantilever paddle of claim 3, wherein the ceramic paddle comprises silicon carbide.

5. The cantilever paddle of claim 4, wherein the silicon carbide comprises recrystallized silicon carbide.

6. A ceramic cantilever paddle for use in semiconductor wafer processing which comprises a carrier zone extending from a handle via a carrier transition zone wherein the handle comprises two sections comprising:

a) a large diameter section having a proximal end and a distal end, the distal end of the large diameter section extending to the carrier transition zone; and b) a small diameter section having a proximal end and a distal end, the distal end of the small diameter section extending to the proximal end of the large diameter section via a handle transition zone, the handle having an effective length "A" commencing from the proximal end of the small diameter section and extending to the carrier transition zone, wherein i) the handle transition zone begins along the effective length "A" of the handle no further distally than the midpoint of the effective length "A";

ii) the height of the large diameter section of the handle is no greater than twice the height of the small diameter section of the handle;

iii) the length of the handle transition zone is no more than half of the effective length "A"; and iv) the large diameter section of the handle and the small diameter section of the handle each define a central axis, whereby the central axis of the large diameter section of the handle is substantially colinear with the central axis of the small diameter section of the handle.

7. The cantilever paddle of claim 6, wherein the ceramic paddle comprises silicon carbide.

8. The cantilever paddle of claim 7, wherein the silicon carbide comprises recrystallized silicon carbide.

9. A ceramic cantilever paddle for use in semiconductor wafer processing which comprises a carrier zone extending from a handle via a carrier transition zone wherein the handle has an effective length "A" commencing from the proximal end of the small diameter section and extending to the carrier transition zone and comprises two sections comprising:

a) a large diameter section having a proximal end and a distal end, the distal end of the large diameter section extending to the carrier transition zone, wherein the height of the large diameter section of the handle is no greater than twice the height of the small diameter section of the handle; and b) a small diameter section having a proximal end and a distal end, the distal end of the small diameter section extending to the proximal end of the large diameter section via a handle transition zone, the length of the handle transition zone being no more than half of the effective length "A".

\* \* \* \* \*